United States Patent
Uesaka et al.

(10) Patent No.: US 7,358,818 B2
(45) Date of Patent: Apr. 15, 2008

(54) OPTICAL RECEIVER FOR AN OPTICAL COMMUNICATION

(75) Inventors: Katsumi Uesaka, Yokohama (JP); Naoki Nishiyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 95 days.

(21) Appl. No.: 10/968,353

(22) Filed: Oct. 20, 2004

(65) Prior Publication Data

US 2005/0140454 A1 Jun. 30, 2005

(30) Foreign Application Priority Data

Oct. 20, 2003 (JP) ............................. 2003-359745
Sep. 10, 2004 (JP) ............................. 2004-264130

(51) Int. Cl.
*H03F 3/08* (2006.01)
(52) U.S. Cl. ........................ 330/308; 330/278; 330/86
(58) Field of Classification Search ................ 330/308, 330/110, 278, 86; 250/214 A
See application file for complete search history.

(56) References Cited

U.S. PATENT DOCUMENTS

| | | | | |
|---|---|---|---|---|
| 5,302,911 A | * | 4/1994 | Miyashita | 330/110 |
| 5,363,064 A | * | 11/1994 | Mikamura | 330/308 |
| 5,382,920 A | | 1/1995 | Jung | |
| 5,589,682 A | * | 12/1996 | Brown et al. | 250/214 A |
| 6,246,284 B1 | * | 6/2001 | Nemoto | 330/110 |
| 6,303,922 B1 | * | 10/2001 | Kasper | 250/214 A |
| 6,972,880 B1 | * | 12/2005 | Kanesaka | 398/160 |
| 6,989,717 B2 | * | 1/2006 | Nogami et al. | 330/308 |
| 2004/0145799 A1 | | 7/2004 | Sedic | |

FOREIGN PATENT DOCUMENTS

JP 09-232877 9/1997
JP 10-150417 6/1998

* cited by examiner

*Primary Examiner*—Patricia Nguyen
(74) *Attorney, Agent, or Firm*—McDermott Will & Emery LLP

(57) ABSTRACT

The present invention provides an optical receiver operable for optical signals each having different transmission speed. The optical receiver includes a light-receiving device, a pre-amplifier, a main amplifier, and a control circuit. The pre-amplifier, may be a trans-impedance amplifier, includes a parallel connection of a switching device and a resistor in a trans-impedance or a load element. By switching ON/OFF the switching device, the gain and the bandwidth of the pre-amplifier may be changed. By providing a filter circuit, whose cut-off frequency may be switched, in the main amplifier, the bandwidth of the optical receiver may be varied.

13 Claims, 8 Drawing Sheets

OPTICAL RECEIVER FOR AN OPTICAL COMMUNICATION

BACKGROUND OF THE INVENTION

1. Filed of the Invention

The present invention relates to a pre-amplifier used in an optical communication system, especially relates to a pre-amplifier having a trans-impedance configuration.

2. Related Prior Art

In a light-receiving system used in the optical communication system, the pre-amplifier that converts an optical signal received by a light-receiving device into a voltage signal is necessary to have a low noise feature and a wide dynamic range. The trans-impedance amplifier is well known to satisfy such requests and is widely used in the optical communication system. Typical trans-impedance amplifier has a configuration that a feedback resistor is connected between the input and the output thereof, the impedance of which may be varied as the input power, thus the wide dynamic range may be obtained. A Japanese patent published as H09-232877 has disclosed such configuration of the trans-impedance amplifier.

FIG. 11 is a schematic figure showing a typical pre-amplifier. The pre-amplifier configures an amplifying circuit 2 with a trans-impedance 3 connected in parallel to the amplifying circuit 2, and a light-receiving device such as photodiode connected in an input terminal of the amplifying circuit 2. The trans-impedance 3 has, for example, a feedback resistance Rf with a variable resistance device Qf, such as field effect transistor (FET), connected in parallel thereto. The impedance of the variable resistor may be varied with a control signal output from the control circuit 4 according to the output of the amplifying circuit 2.

The light-receiving device 1 outputs a current Iin corresponding to the magnitude of the optical signal received thereby, and the current, when the input impedance of the amplifying circuit 2 is large enough, may flow into the trans-impedance 3 and make a potential drop therein, thereby generate the output Vout of the amplifying circuit 2. That is, the signal current Iin may be converted into the voltage signal Vout. Setting the feedback resistance is Rf, the relating between the signal current Iin and the voltage output Vout becomes Vout=□Iin*Rf. In this pre-amplifier, enough sensitivity may be obtained for the faint signal current, namely, the output signal with enough magnitude may be realized, by setting the resistance Rf of the feedback resistor large.

However, when the resistance of the feedback resistor Rf is large, saturation in the output signal may occur at the large signal current, which distorts the waveform of the output signal. Such saturation in the output of the pre-amplifier may be prevented by setting the impedance of the trans-impedance 3 equivalently small when the large signal current is input thereto, thus wide dynamic range may be obtained.

In general, as shown in FIG. 11, a parallel connection of a FET Qf with the feedback resistor Rf is well known for the trans-impedance circuit 3. In this circuit, when the input current is below a preset value, the transistor Qf is switched OFF and only the feedback resistor Rf may operate as the trans-impedance. When the output of the pre-amplifier becomes large and the input current exceeds the preset value, the gate bias of the transistor Qf is varied under the control of the control circuit 4, which makes the conduction between the source and the drain and the trans-impedance 3 small, thereby preventing the saturation in the output of the pre-amplifier.

Further, when the single device receives optical signals each having different transmission speed, the light-receiving sensitivity is widely scattered. One configuration, in which a plurality of resistors each serially connected may be selectively switched ON/OFF, is well known. The United States patent U.S. Pat. No. 5,382,920 has disclosed such configuration. According to the configuration above, the feedback impedance may be widely varied, thereby following the change of the transmission speed.

Still another art has disclosed that, providing a wideband amplifier capable of covering the high transmission speed and a plurality of band-pass filter each connected to the wideband amplifier, and the optical receiver may be operated at different transmission speed by selecting one band-pass filter optimal to the transmission speed practically received by the optical receiver. This technique has been disclosed in Japanese Patent application published as H10-150417. Generally in the amplifier, the product of the gain and the bandwidth thereof (GB product) shows constant. Therefore, using the wideband amplifier, the gain of the amplifier must be reduced, accordingly, restricting the application of the amplifier.

In the recent optical communication, one transmission system is used, in which two standards of the SONET (Synchronous Optical NET) in accordance with the United States standard and the SDH (Synchronous Digital Hierarchy) in accordance with the international standard are multiplexed. Various transmission speeds, for example 155.52 Mbps and its integral multiplications such as 622.08 Mbps and 2.48832 Gbps, are specified commonly to the SONET and the SDH standards. In these cases, the sensitivity specified for transmission speeds are −34 dBm, −28 dBm and −18 dBm, respectively. The higher sensitivity is required for the lower transmission speed.

To obtain a trans-impedance pre-amplifier operating at such widely different transmission speed requires not only the function of receiving optical signals but also the performance satisfying the optical sensitivity specified in the standard for respective transmission speed. One solution is provided in a trans-impedance amplifier shown in FIG. 11, in which the feedback resistance thereof may be precisely adjusted as the transmission speed varies.

On the other hand, the bandwidth of the trans-impedance amplifier, which is denoted as a frequency fc where the gain thereof decreases by 3 dB compared to that at low frequencies, is denoted as follows when the intrinsic gain of the amplifier is a finite value:

$$fc=1/(2\pi \cdot R \cdot Cs)/(1+1/A),$$

where A is the intrinsic gain of the amplifier, R is the resistance of the feedback resistor, and Cs is input capacitance, which is sum of the junction capacitance of the light-receiving device, input capacitance of the pre-amplifier, and parasitic capacitance derived from the configuration of the assembly of the pre-amplifier and the light-receiving device. The frequency bandwidth of the pre-amplifier may vary by adjusting the resistor R with the change of the transmission speed. However, to obtain an optimal frequency bandwidth of the pre-amplifier, it is insufficient to adjust the resistor R but requires to controlling the intrinsic gain A of the pre-amplifier.

In prior pre-amplifiers mentioned above, the control of the intrinsic gain A concurrently to the control of the feedback resistance R has not been taken into consideration. Even the control of the intrinsic gain A has been mentioned, the control thereof has been independent on that of the feedback resistance R. Therefore, it has not been solved to acquire an optimal gain, an optimal frequency bandwidth and an input dynamic range for respective transmission speeds.

Therefore, one object of the present invention is to provide a pre-amplifier having a trans-impedance type that receives optical signals whose transmission speeds are widely different to each other and provides a wide dynamic range of the input sensitivity for respective transmission speeds with an optimal frequency bandwidth.

SUMMARY OF THE INVENTION

An optical receiver according to the present invention provides a light-receiving device, a pre-amplifier, a main amplifier and a control circuit. The light-receiving device receives optical signal each having different transmission speeds and generates signal currents corresponding to the optical signals. The pre-amplifier provides an input terminal, an output terminal and a control terminal. The input terminal is connected to one terminal of the light-receiving device to receive the signal current generated by the light-receiving device. The output terminal outputs voltage signals converted from the signal currents. The control terminal receives a control signal by which gain and frequency bandwidth of the pre-amplifier may be adjusted. The main amplifier receives the voltage signals output from the pre-amplifier and amplifies the voltage signals. The control circuit outputs the control signal in accordance with the transmission speed of the optical signals.

The light-receiving device is preferably to vary the frequency bandwidth in accordance with a bias voltage applied to the other terminal thereof. A PIN photodiode may be applied for the light-receiving device of the present invention.

The pre-amplifier may be a type of a trans-impedance amplifier that includes an amplifying circuit and a trans-impedance. The amplifying circuit is disposed between the input and the output terminals of the pre-amplifier, and inverts a phase of the signal voltage output from the output terminal against the current signal input to the input terminal. The trans-impedance is connected between the input and the output terminals of the pre-amplifier, and includes at leas one resistor and at least one circuit unit that has a parallel connection of a switching device and a resistor. The gain and the frequency bandwidth of the pre-amplifier may be varied by controlling the switching device with the control signal input to the control terminal thereof.

The pre-amplifier may include an amplifying circuit that is disposed between the input and the output terminals thereof and has a transistor and a load circuit connected to the transistor. The load circuit may include at least one resistor and at least a circuit unit that has a parallel connection of a switching device and a resistor. The gain and the frequency bandwidth of the pre-amplifier may be varied by controlling the switching device with the control signal applied to the control terminal.

At least one resistor and at least one circuit unit provided in the pre-amplifier may be connected in parallel to each other, or may be connected in serial to each other. Moreover, a variable resistor may be connected in serial to at least one resistor The variable resistor may be a transistor that has a control terminal and two current terminals with equivalent resistance therebetween. The equivalent resistance of the transistor may be varied by providing the control signal to the control terminal of the transistor.

The optical receiving of the present invention may further include a housing that has a stem and a die capacitor mounted on a center portion of the stem. The light-receiving device may be disposed on a substantially center of the stem via the die capacitor. The control signal may be provided from the control circuit that is disposed outside of the housing.

The stem may further provide a lead pin to provide the control signal to the other terminal of the light-receiving device and the control terminal of the pre-amplifier therethrough.

The optical receiver may further include a control buffer circuit within the housing. The control signal may be provided to the other terminal of the light-receiving device via the lead pin and to the control terminal of the pre-amplifier via the lead pin and the control buffer circuit.

The main amplifier of the present optical receiver may have a control terminal for inputting the control signal thereto. The control signal varies the frequency bandwidth of the main amplifier.

The main amplifier of the present invention may include a first circuit, a filter circuit and a second circuit. At least one of the first and the second circuits may have gain and the filter circuit may vary the cut-off frequency thereof by providing the control signal thereto. The filter circuit may include a circuit unit that has a switching device and a capacitor connected in serial to the switching device. The cut-off frequency of the filter circuit may be switched by providing the control signal to the switching device to conduct the capacitor.

Figure 2A:
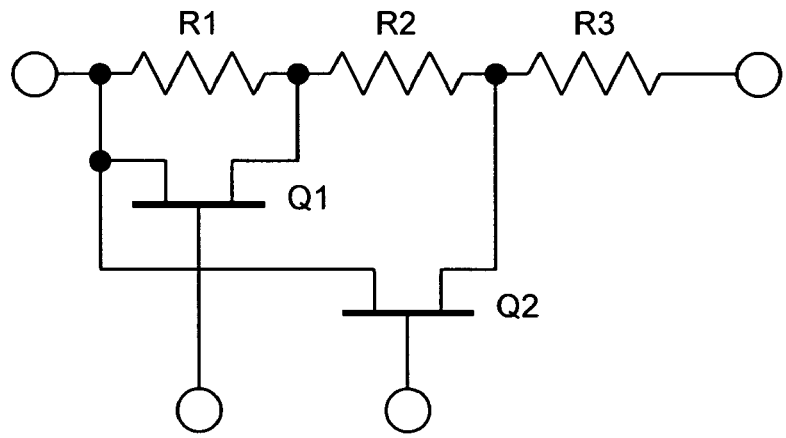
Figure 2B:
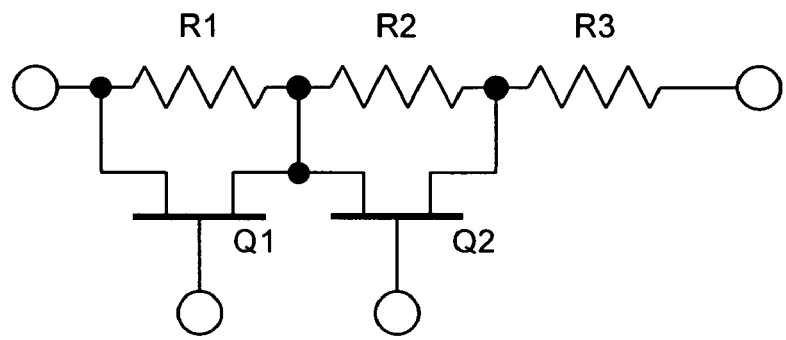
Figure 2C:
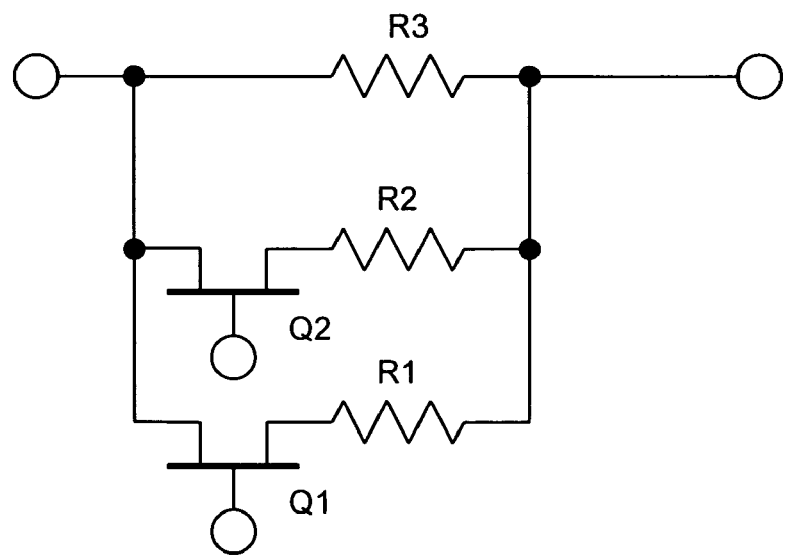
Figure 3:
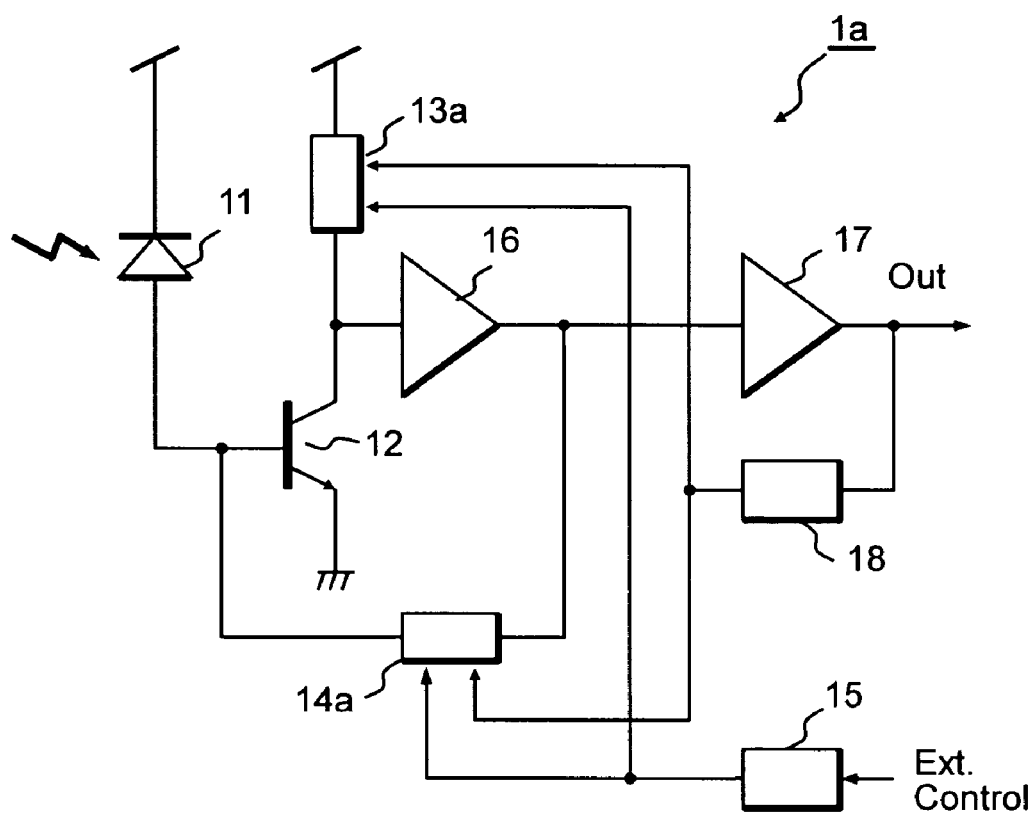
Figure 4A:
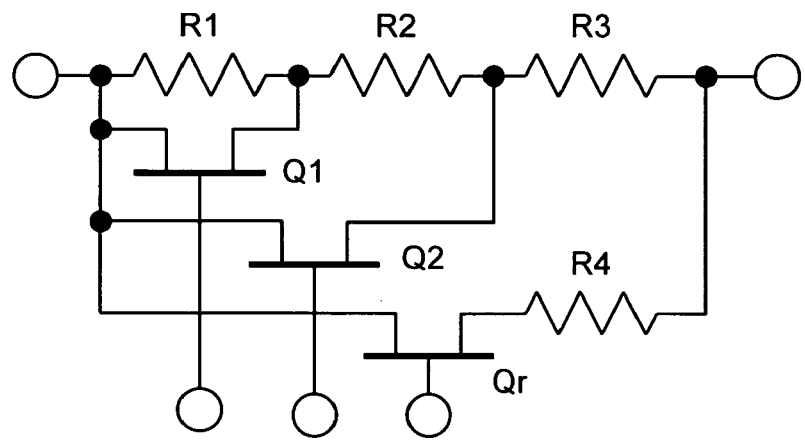
Figure 4B:
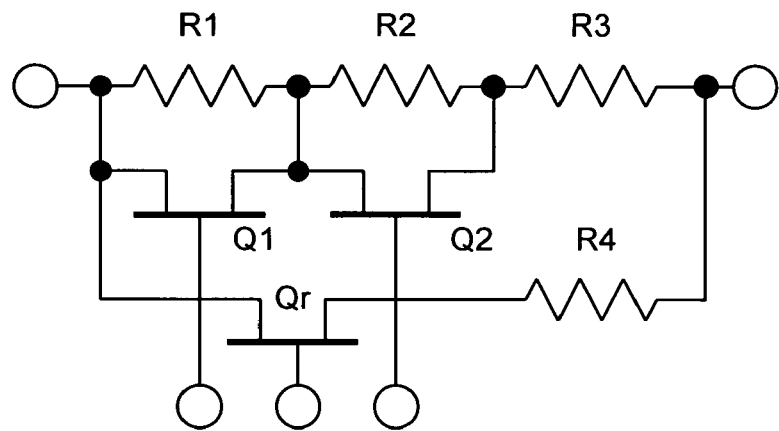
Figure 4C:
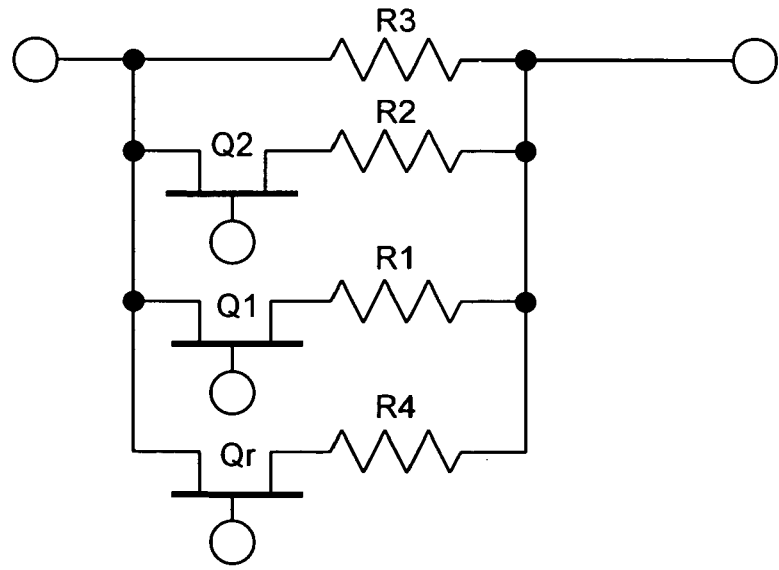
Figure 5:
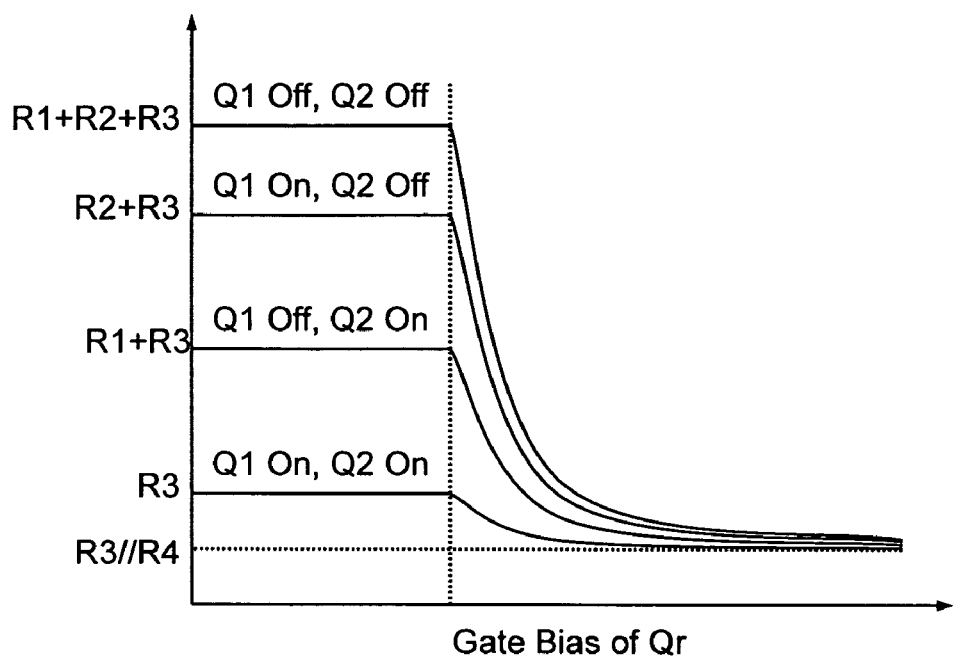
Figure 6:
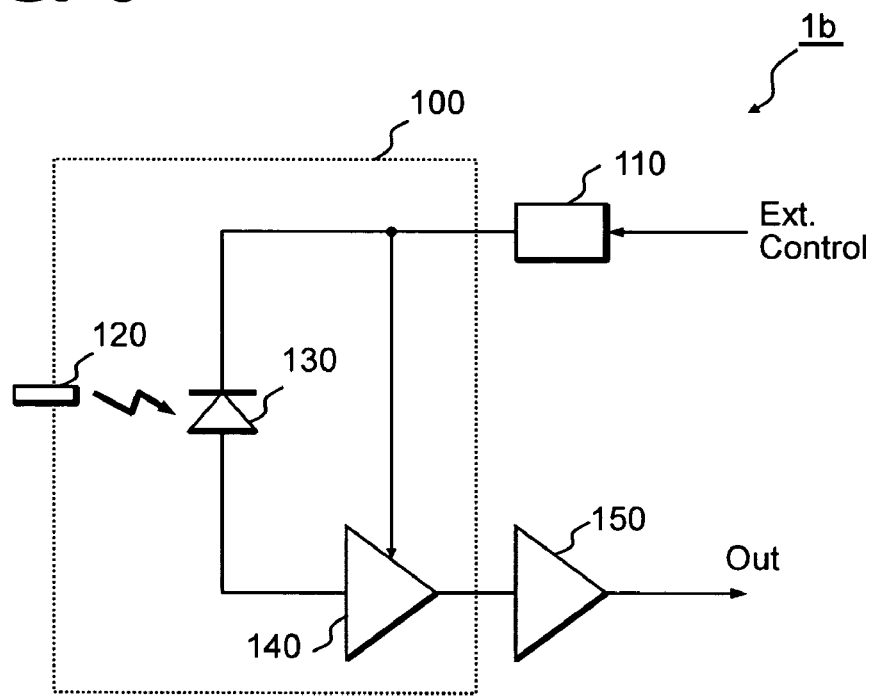
Figure 7:
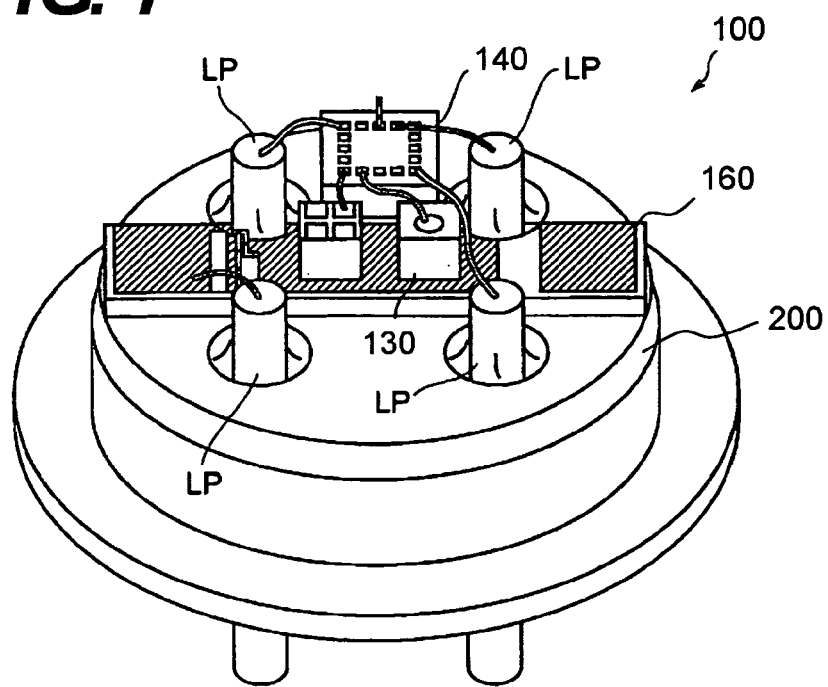
Figure 8:
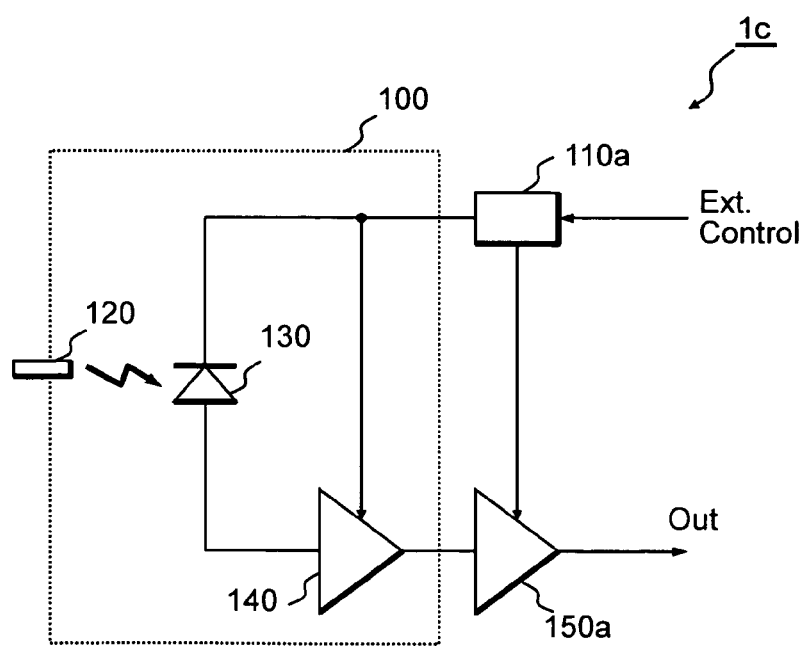
Figure 9:
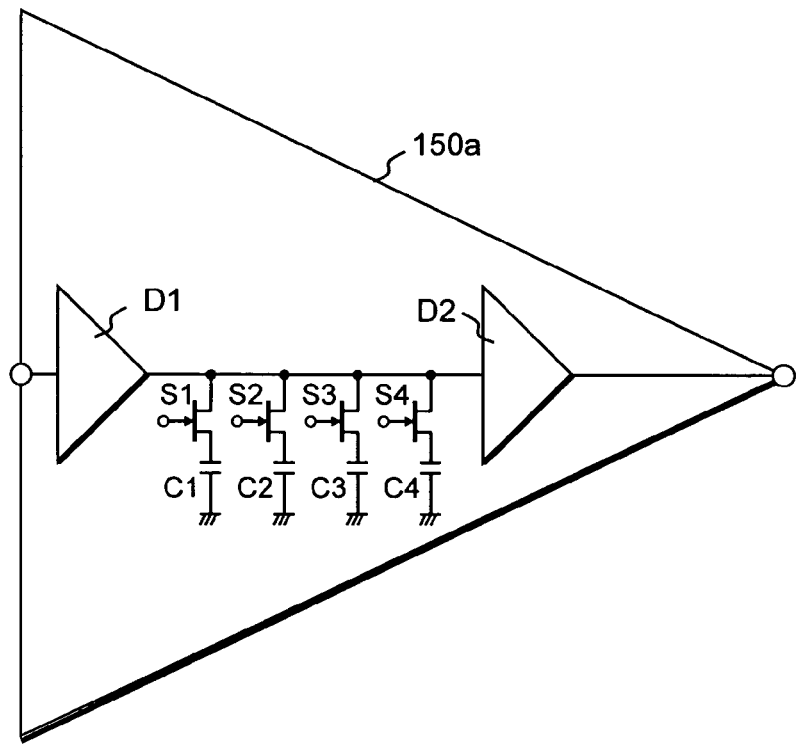
Figure 10:
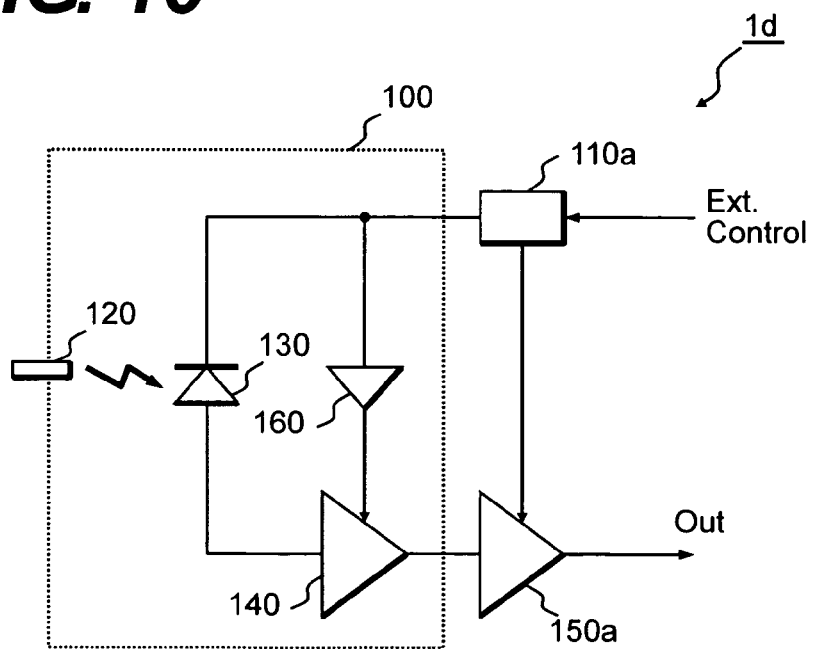
Figure 11:
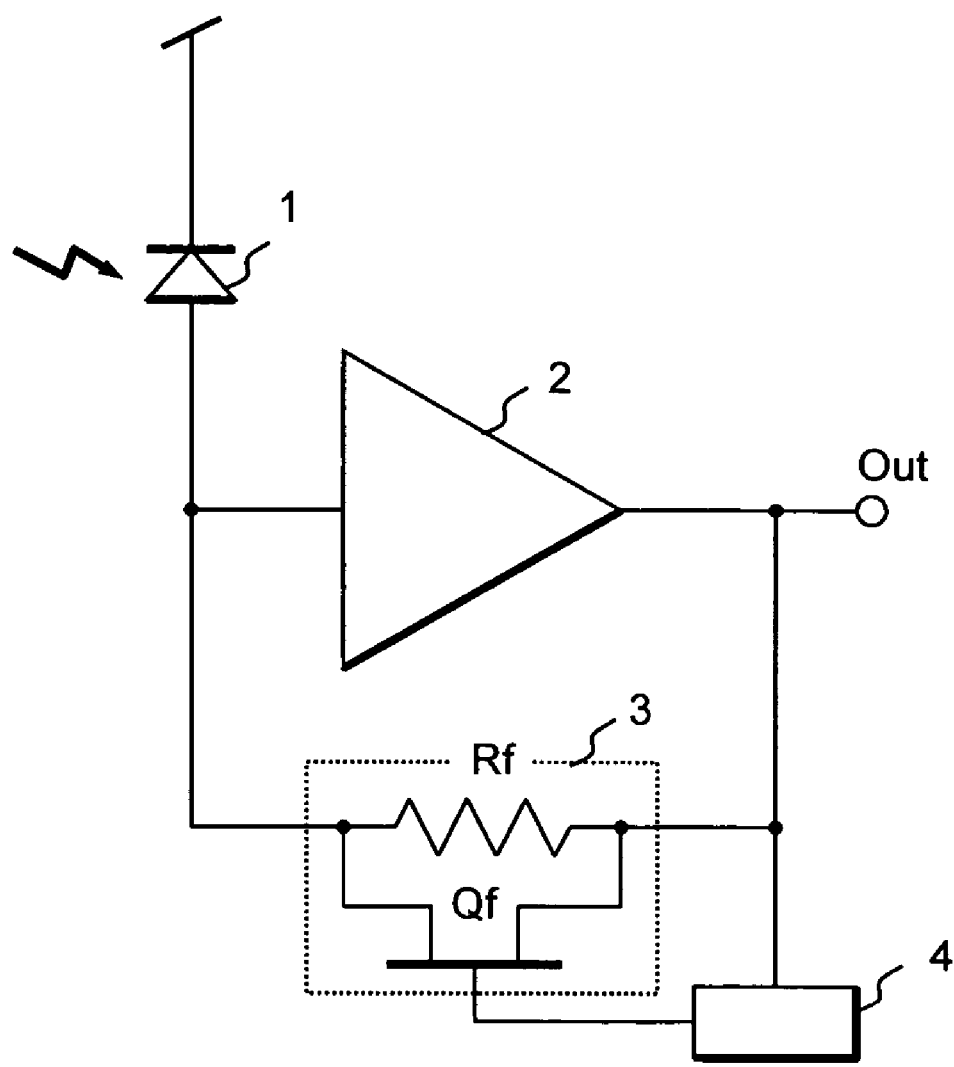

from FIG. 2A to FIG. 2C show circuit configurations of the trans-impedance or the load for the amplifier;

FIG. 3 is a block diagram of the optical receiver according to the second embodiment;

from FIG. 4A to FIG. 4C show circuit configuration of the trans-impedance or the load for the amplifier;

FIG. 5 shows the relation between the bias input to the control terminal of the transistor and the equivalent resistance thereof in the configurations shown from FIG. 4A to FIG. 4C;

FIG. 6 is a block diagram of the optical receiver according to the third embodiment;

FIG. 7 is a perspective view showing the light-receiving device and the pre-amplifier being installed in the housing having a co-axial type package;

FIG. 8 is a block diagram of the optical receiver according to the fourth embodiment;

FIG. 9 shows a configuration of the main amplifier that provides the variable bandwidth;

FIG. 10 is a block diagram of the optical receiver according to the fifth embodiment; and FIG. 11 shows a conventional optical receiver.

DETAILED DESCRIPTION OF PREFERRED EMBODIMENTS

Next, preferred embodiments of the present invention will be described as referring to accompanying drawings.

First Embodiment

Figure 1:
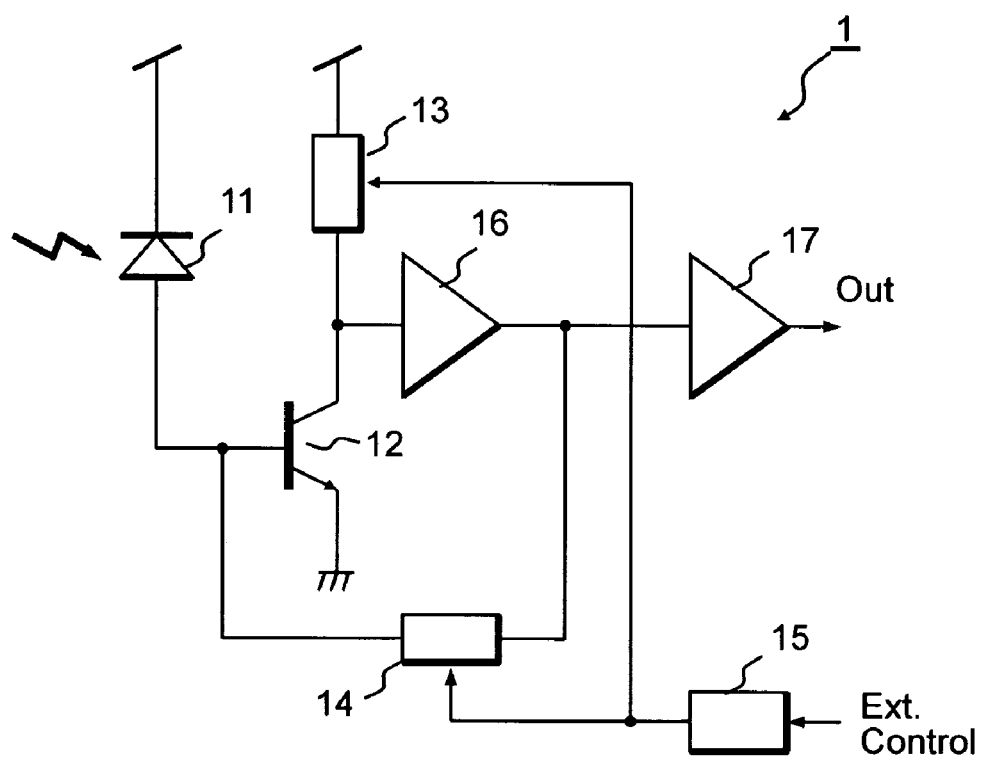
FIG. 1 is a block diagram of the optical receiver according to the first embodiment.

FIG. 1 shows a block diagram of a pre-amplifier 1 for the optical communication according to the present invention. The pre-amplifier 1 includes a transistor 12, which has a function of an inverting amplifier, a gain control circuit 13, a trans-impedance 14, a decoder 15, a level shifter 16, and an output buffer 17. This pre-amplifier, because of its intrinsic characteristic to convert an optical signal detected by a light-receiving device 11 to a corresponding electrical signal by current-to-voltage conversion, is used for the optical communication. The photo current generated by the light-receiving device 11 is input to the base of the transistor 12. The transistor 12 constitutes the gain control circuit 13 with a load resistance thereof and the gain control circuit decides the intrinsic gain of the pre-amplifier. The output of the gain control circuit 13 is adjusted in its level by the level shifter 16 to operate the trans-impedance 14. The output of the level shifter 16 is led to a main amplifier, which is not shown in FIG. 1, via the output buffer 17.

In the pre-amplifier 1 of the present invention, the gain control circuit 13 and the trans-impedance 14 have a function to change the intrinsic gain and the value of the trans-impedance by inputting information about the transmission speed. It is able to select an optimal gain and an optimal trans-impedance for a specific transmission speed such as OC-3, OC-12 and OC-48, which are specified in the SONET standard. The information of the transmission speed is coded by the decoder 15, and is input to the gain control circuit 13 and the trans-impedance 14 to change the value thereof.

To adjust the value of the trans-impedance 14 may change the gain of the pre-amplifier 1. However, the amount of change is smaller compared to that due to the change of the gain control circuit 13. Therefore, it is able not only to reduce degradation in the optical sensitivity but also to maintain the frequency bandwidth of the pre-amplifier by adjusting both the gain control circuit 13 and the trans-impedance 14 of the pre-amplifier 1 based on the information on the transmission speed.

FIG. 2 shows configurations of the gain control circuit 13 and the trans-impedance 14. As shown in FIG. 2, these circuits are comprised of a plurality of resistors R1, R2, and R3 connected between terminals A and B, and switching devices such as a field effect transistor (FET) Q1 and Q2 each connected in parallel or in series to respective resistors. Switching devices Q1 and Q2 are switched in OFF or switched ON state by the decoder 15 according to the information on the transmission speed. In FIG. 2, three resistors and two switching devices are shown. However, the gain control circuit 13 and the trans-impedance 14 may be comprised further resistors and switching devices.

FIG. 2A shows an example, in which three resistors R1, R2 and R3 are serially connected to each other, and the transistor Q1 is connected in parallel to the resistor R1, while the transistor Q2 is connected in parallel to resistors R2 and R3 both connected in serial. Switching on the transistor Q1, the resistor R1 is short-circuited and the total resistance between terminals A and B becomes R2+R3. On the other hand, when the transistor Q2 is switched ON and serially connected resistors R1+R2 is short-circuited, the resistance between terminal A and B becomes R3 only.

FIG. 2B shows another example, in which three resistors R1, R2, and R3 are serially connected to each other, and the switching transistor Q1 is connected in parallel to the resistor R1, and another switching transistor Q2 is connected in parallel to the resistor R2. When two transistors Q1 and Q2 are switched OFF, the total resistance between terminals A and B becomes R1+R2+R3 same as the case that is shown in FIG. 2A. By switching ON the transistor Q1, the resistor R1 is short-circuited and the total resistance between terminals A and B becomes R2+R3. When two transistors Q1 and Q2 are switched ON in the same time, serially connected resistors R1+R2 are short-circuited and the total resistance between terminals A and B becomes the resistor R3 only. When the transistor Q1 is switched OFF while the other transistor Q2 is switched ON, only the resistor R2 is short-circuited and the total resistance between terminals may become R1+R3.

FIG. 2C shows still another example, in which three resistors R1, R2 and R3 are connected in parallel to each other, and the transistor Q1 is in serial to the resistor R1 while the other transistor Q2 is in serial to the resistor R2. When two transistors Q1 and Q2 are switched OFF in the same time, the total resistance between terminals A and B becomes the resistor R3 only. By switching ON the transistor Q1, the configuration becomes resistors R1 and R3 connected in parallel to each other and the total resistance between terminals A and B becomes R1//R3=(R1·R3)/(R1+R3). When two transistors are switched ON in the same time, the total resistance between terminals A and B becomes R1//R2//R3=(R1·R2·R3)/(R1·R3+R1·R2+R2·R3). When the transistor Q1 is switched OFF, while the other transistor Q2 is switched ON, the total resistance between terminals A and B may become R2//R3=(R2·R3)/(R2+R3).

By selecting the ON/OFF state of the transistors Q1 and Q2 based on the signal provided from the decoder 15, the resistance between terminals A and B may be varied in digital. Further, it is preferable that at least one resistor may be active between terminals A and B independent on the ON/OFF state of the switching transistor. In FIG. 2, the third resistor R3 is always active between terminals A and B.

By providing the resistor that is always active, exceptional cases such as an infinite or zero trans-impedance may be avoided even when all switching devices are switched ON or switched OFF. Ordinary trans-impedance amplifier does not provide any protective devices in the input stage thereof to reduce the input capacitance. Therefore, when the trans-impedance becomes infinite, which means that the input impedance of the trans-impedance amplifier becomes huge at no power supply voltage, the hardness for the electrostatic discharge remarkably reduces. By providing at least one resistor always active, this degradation of the hardness for the electro-static discharge may be prevented.

Second Embodiment

FIG. 3 explains a pre-amplifier 1a according to another embodiment of the present invention. This pre-amplifier 1a provides an output level detector 18 in addition to the elements involved in the previous pre-amplifier shown in FIG. 1. In this embodiment, the pre-amplifier 1a may be controlled in its gain and the bandwidth based on the signal detected by the output level detector 18 in addition to control of the gain control circuit 13a and the trans-impedance 14a by the information on the transmission speed.

The information on the transmission speed is simultaneously input to the gain control circuit 13a and the trans-impedance 14a, and the gain of the pre-amplifier and the trans-impedance may be varied in rough, while the output level detector 18 detects the output of the output buffer 17 and leads thus detected output level to the gain control circuit 13a and the trans-impedance 14a. The level detected by the output level detector 18 may be an average or a peak value thereof.

The level detected by the output level detector 18 is input in simultaneously to the gain control circuit 13a and the trans-impedance 14a, and to adjust the gain of the pre-amplifier 1a and the trans-impedance in analog. In the present embodiment, the signal from the decoder 15 roughly controls the gain control circuit 13a and the trans-impedance 14a in digital, while the signal form the output level detector 18 finely adjusts in analog. Thus, the intrinsic gain and the frequency bandwidth optimal to the specific transmission speed, and the wide dynamic range may be obtained even when the transmission speed is widely varied.

FIG. 4 shows configurations of the gain control circuit 13a and the trans-impedance 14a that correspond to the case shown in FIG. 3. The gain control circuit 13a and the trans-impedance 14a may be comprised a plurality of resistors R1, R2, R3 and R4 connected in serial, in parallel, or intermingled with both connections, between terminals A and B, switching devices Q1 and Q2 such as field effect transistor (FET), and variable resistors Qr, for example an FET, connected in parallel or in serial to respective resistors. The switching devices Q1 and Q2 are controlled in their ON/OFF state by the information on the transmission speed, while the variable resistor Qr is controlled by the level signal output from the output level detector 18.

FIG. 4A shows an example, in which three resistors R1, R2 and R3 are connected in serial to each other, the transistor Q1 is connected in parallel to the resistor R1, the other transistor Q2 is connected in parallel to resistors R1+R2, and the variable resistor Qr with the resistor R4 connected in serial thereto are connected in parallel to resistors R1+R2+R3. When both transistors Q1 and Q2 are switched OFF, the total resistance between terminals A and B becomes a combination of three resistors R1+R2+R3 connected in parallel to two resistors Qr+R4. Next, when the transistor Q1 is switched ON to short-circuit the resistor R1, the total resistance between terminals A and B becomes a combination of two resistors R2+R3 and another two resistors Qr+R4 connected in parallel to the former two resistors. When the transistor Q2 is further switched ON to short-circuit two resistors R1+R2, the total resistance between terminals A and B becomes the combination of the resistor R3 and two resistors Qr+R4 connected in parallel to the former resistor R3. Since all switching status described above, the variable resistor Qr may be controlled independent on the two transistors Q1 and Q2, the total resistance between terminals A and B may be finely adjusted in analog by the equivalent resistance of the variable resistor Qr.

FIG. 4B shows another example, in which three resistors R1, R2, and R4 are connected in serial, the transistor Q1 is connected in parallel to the resistor R1, the other transistor Q2 is connected in parallel to the resistor R2, and the variable resistor Qr with the fourth resistor R4 connected in serial thereto is connected in parallel to the serially connected resistors R1+R2+R3. When two transistors Q1 and Q2 are switched OFF, the total resistance between terminals A and B becomes a parallel combination of three resistors R1+R2+R3 and the serially connected resistors Qr+R4. When the transistor Q1 is switched ON to short-circuit the resistor R1, the total resistance between terminals A and B becomes a parallel combination of two resistors R2+R3 and the serially connected resistors Qr+R4. When the first transistor is switched OFF and the other transistor is switched ON to short-circuit the resistor R2 only, the total resistance between terminals A and B becomes a parallel combination of two resistors R1+R3 and the serially connected resistors Qr+R4. In respective switching status, the variable resistor Qr may be finely controlled in analog independent on the control of two transistors Q1 and Q2, whereby the total resistance between terminals A and B may be also finely controlled in analog.

FIG. 4C shows still another configuration, in which four resistors R1 to R4 are connected in parallel to each other, the transistor Q1 is connected in serial to the resistor R1, the other transistor Q2 is connected in serial to the resistor R2, and the variable resistor Qr is connected in serial to the resistor R4. In this configuration, when two transistors Q1 and Q2 are simultaneously switched OFF, the total resistance between terminals A and B becomes a parallel combination of the resistor R3 and the serially connected resistors Qr+R4. When the transistor Q1 is switched ON, the total resistance becomes the parallel combination of the resistor R1, the resistor R3 and the serially connected resistors Qr+R4. When both transistors Q1 and Q2 are switched ON, the total resistance becomes the parallel combination of the resistor R1, the resistor R2, the resistor R3 and the serially connected resistors Qr+R4. When the transistor Q1 is switched OFF while the other transistor Q2 is switched ON, the total resistance between terminals A and B becomes the parallel combination of the resistor R2, the resistor R3, and the serially connected resistors Qr+R4. In every cases described above, the variable resistor Qr is finely and independently controlled in analog, thereby enabling to adjust the total resistance between terminals A and B in analog.

As previously described, by controlling the ON/OFF status of the transistors Q1 and Q2 based on the signal from the decoder 15, the specific resistance may be digitally set between terminals A and B. Further, a variable resistor Qr may be connected in parallel to at least one resistor among resistors, these are connected in parallel or in serial to each other. For the variable resistor Qr, the level signal output from the output level detector 18 is provided and the resistance thereof may be adjusted in analog. Thus, the total resistance between terminals, which are digitally set depending of the transmission speed, may be finely adjusted in analog.

Further, when the variable resistor Qr is a field effect transistor, it is preferable to connect a resistor R4 in serial thereto to weaken the dependence of the equivalent resistance of the FET on the gate bias, which simultaneously escapes from the zero condition of the total resistance between terminals when other resistors are short-circuited under the specific condition of the switching transistors.

FIG. 5 simulates the total resistance between terminals A and B of the embodiment shown in FIG. 4B when the variable resistor Qr is an FET. The horizontal axis denotes the gate bias of the variable resistor Qr, while the vertical axis corresponds to the total resistance between terminals A and B. As shown in FIG. 5, in the configuration shown in FIG. 4B, when two transistors Q1 and Q2 are switched OFF and the gate bias of the variable resistor Qr is small not to conduct the current, the total resistance between terminals becomes a constant value of R1+R2+R3. When the FET Qr for the variable resistor becomes conductive between the source and the drain thereof, the total resistance becomes small as the equivalent resistance between the source and the drain of the FET Qr becomes small. Finally, when the gate bias is further increased and the equivalent resistance between the source and the drain is the minimum, which may be regarded as the FET Qr is short-circuited, the total resistance between terminals A and B becomes the parallel combination of three resistors R1+R2+R3 and the resistor R4.

Switching on the transistor Q1, the resistor R1 is short-circuited and the total resistance between terminals A and B becomes a maximum value of R2+R3, which is maintained till the transistor Qr begins to be conducted. Next, as the gate bias of the transistor Qr exceeds a preset voltage, the total resistance between terminals A and B becomes small because the conduction between the source and the drain of the transistor has occurred and the equivalent resistance therebetween becomes smaller. Finally, when the transistor Qr is switched ON, the total resistance becomes the parallel combination of two resistors R2+R3 and the other resistor R4. Similarly, when two transistors Q1 and Q2 are switched ON, the total resistance between terminals A and B holds a maximum value of R3 till the transistor Qr begins to be conducted. Exceeding a preset value for the gate bias of the transistor Qr, the total resistance becomes small because the transistor Qr is conducted between the source and the drain thereof and the equivalent resistance becomes small, and finally, the total resistance becomes parallel combination of the resistance R3 and the resistance R4. When resistors R1, R2 and R3 are set to be far greater than the resistor, i.e. R4, (R1, R2, R3)>>R4, the final resistance when the transistor Qr is completely switched ON is able to be equal to the resistor R4 independent on the other resistors R1, R2, and R3. Moreover, by setting the resistor R4 to be small enough but not zero, the bandwidth of the pre-amplifier may be enhanced to the frequency that is determined by the junction capacitance inherently appeared in the transistor 12 and parasitic capacitance or inductance attributed to the wiring of the pre-amplifier.

Third Embodiment

Next, the third embodiment of the present invention will be described. FIG. 6 shows a block diagram of an optical receiver 1b according to the third embodiment. As shown in FIG. 6, the optical receiver 1b includes a control circuit 110, an optical fiber 120, a photodiode 130, a pre-amplifier 140, and a main amplifier 150.

The control circuit 110 outputs a bias signal to the photodiode 130 and the pre-amplifier 140 based on a control signal received outside of the optical receiver 1b. The control signal, when the optical receiver 1b has an interface to a host system, which is not shown in FIG. 6, such as a small form factor pluggable transceiver (SFP), may be a signal output from the host system. The control signal may include information on the transmission speed. Therefore, the control circuit 110 may output the bias signal corresponding to the transmission speed.

The photodiode 130 receives light output from the optical fiber 120 and converts the light into an electrical (current) signal. The photodiode is reversely biased by the bias signal output from the control circuit 110.

The pre-amplifier 140 converts the current signal output from the photodiode 130 into a voltage signal. The pre-amplifier of the present embodiment 140 has functions of variable gain and variable bandwidth, that is, it enables to vary the gain and the bandwidth by the bias signal provided from the control circuit 110. The main amplifier 150 amplifies the voltage signal output from the pre-amplifier. The pre-amplifier 140 may has the configuration 1 shown in FIG. 1 or another configuration 1a shown in FIG. 3.

In the optical receiver 1b of the present embodiment, the photodiode 130 and the pre-amplifier 140 are disposed within a receiving optical sub-assembly (ROSA), which is an optical module for the optical communication.

Next, the configuration of the ROSA 100 will be described as referring to FIG. 7. The ROSA shown in FIG. 7 has a co-axial outer shape with a stem 200, which is called as a TO-type package. The photodiode 130 is mounted on a center portion of the ROSA 100 with a die capacitor 160.

The pre-amplifier 140 is disposed immediate side of the photodiode 130, upper side in FIG. 7. Thus, to install the pre-amplifier 140 just beside the photodiode 130 is due to the feeble current output from the photodiode to be influenced by the electromagnetic field appeared outside of the ROSA 100 and is to enhance the tolerance to the noise from the outside. Moreover, the die capacitor 160 functions as the coupling capacitance provided for the power supply line to the photodiode 130 or to the pre-amplifier 140. The optical fiber 120 is disposed in a center portion of a cap of the ROSA, which is not shown in FIG. 7, such that the light emitted from the tip of the optical fiber 120 enters the photodiode 130 via a lens, which is also not shown in FIG. 7. The ROSA provides lead pins LP to communicate electrical signals with the outside thereof. These lead pins LP are provided for supplying the bias voltage to the photodiode 130, for supplying the power supply to the photodiode 130 and to the pre-amplifier 140, and for extracting signals from the pre-amplifier 140.

In thus configured optical receiver 1b, when the bias voltage output from the control circuit 110 is increased, the junction capacitance of the photodiode 130 is decreased, thereby enhancing the response speed of the photodiode 130.

The bias voltage output from the control circuit 110 is led to the decoder 15 of the pre-amplifier 140, which is shown in FIG. 1 and FIG. 3. By setting the trans-impedance 14 to be small and the load resistance 13 for the collector of the transistor 12 to be small when the bias signal is increased, the gain of the pre-amplifier 140 is to be decreased but the frequency bandwidth thereof may be widened. That is, the optical to electrical conversion efficiency of the ROSA 100 as a whole including the pre-amplifier 140 is decreased but the frequency bandwidth thereof may be widened. On the other hand, by setting the trans-impedance 14 of the pre-amplifier 140 and the collector load resistance 13 of the transistor 12 to be large when the bias signal is small, the optical to electrical conversion efficiency of the ROSA 100 as a whole may be enhanced but the frequency bandwidth thereof may be narrowed. Therefore, the gain and the bandwidth of the pre-amplifier 140 may be controlled according to the bias signal output from the control circuit 110.

Thus, according to the optical receiver 1b of the third embodiment, the bias signal provided to the photodiode 130 is simultaneously supplied to the pre-amplifier 140, and the gain and the frequency bandwidth of the pre-amplifier 140 may be varied according to thus provided bias signal. Since the bias signal is provided to both the photodiode 130 and the pre-amplifier 140, which are disposed within the ROSA 100, it is able to provide the bias signal for the photodiode 130 and the control signal of the gain and the frequency bandwidth for the pre-amplifier 140 through the single lead pin, whereby the ROSA 100 may be configured with a less lead pin.

Fourth Embodiment

The fourth embodiment of the present invention will be described. The optical receiver 1c according to the fourth embodiment has a configuration different to thus described light-receiving apparatus in the points that the main amplifier 150a of the present embodiment has a variable bandwidth and a control signal to vary the bandwidth of the main amplifier 150a is provided from the control circuit 110a. The rest configurations and functions are the same with those appeared in the optical receiver 1b of the previous embodiment.

The main amplifier 150a may be a limiting amplifier. The limiting amplifier has a function to output signals with constant amplitude independent on the amplitude of the input signal by setting the gain thereof to be large enough and operates in the saturated condition. One configuration to increase the gain is to put a plurality of amplifiers each having a large load and connected in serial to each other. One exemplary configuration to limit the signal amplitude is a constant current source connected to the common emitter (or source) of a differential circuit.

One embodiment for the main amplifier 150a, which is a limiting amplifier, having a function to vary the frequency bandwidth thereof by the control signal will be described as referring to FIG. 9. As shown in FIG. 9, the main amplifier 150a includes two amplifiers D1 and D2, four switches from S1 to S4, and capacitors from C1 to C4. The amplifying blocks D1 and D2 are connected in serial to each other. In the main amplifier 150a thus configured, the latter amplifier D2 shows the saturated characteristics. Between the former and the latter amplifiers D1 and D2, a plurality of switches from S1 to S4 is disposed. Between these switches and the ground, respective capacitors from C1 to C4 are connected to configure the RC filter circuit. In the main amplifier 150a, some switches from C1 to C4 are selected according to the control signal provided from the control circuit 110a, thereby varying the frequency bandwidth of the amplifier 150a. The switches from C1 to C4 may be FET switches.

According to the optical receiver 1c of the fourth embodiment, the frequency bandwidth of the main amplifier 150a may be varied by the control signal in addition to the function described in the previous optical receiver 1A of the third embodiment.

Fifth Embodiment

The optical receiver 1d of the fifth embodiment, as shown in FIG. 10, has a difference configuration to the previous optical receiver 1c of the fourth embodiment in that the present optical receiver 1d provide a control buffer 160. The features that the main amplifier 150a is a variable bandwidth amplifier and the control circuit 110a provides the control signal to vary the frequency bandwidth thereof are same as those described accompanying with the fourth embodiment.

The control buffer 160 has high input-impedance and outputs the control signal provided from the control circuit 110a to the pre-amplifier 140 by converting the signal level. Thus, to provide the control buffer 160 with the high input-impedance may prevent the current provided from the control circuit 110b to the pre-amplifier 140 from leaking to the signal current output from the photodiode 130. Further, fluctuation appeared in the control signal provided to the pre-amplifier 140 or that provided to the photodiode 130 may be prevented from being influenced to each other. The level of the control signal provided to the pre-amplifier 140 may be changed optional to that provided to the photodiode 130.

What is claimed is:

1. An optical receiver for receiving optical signals each having different transmission speed and outputting electrical signals corresponding to optical signals, said optical receiver comprising:

a light-receiving device for generating signal currents corresponding to said optical signals;

a pre-amplifier having an input terminal, an output terminal and a control terminal, said input terminal being connected to one terminal of said light-receiving device for inputting said signal current, and said output terminal outputting voltage signals corresponding to said current signals converted by said pre-amplifier, said pre-amplifier including an amplifying circuit and a trans-impedance connected in parallel to said amplifying circuit and disposed between said input and output terminals, said amplifying circuit having a transistor and a load circuit connected to said transistor, said transistor being connected to said input terminal and said load circuit including at least one resistor and at least a first circuit unit having a first switching device and a resistor connected in parallel with each other, said trans-impedance including at least one resistor and a second circuit unit having a second switching device and a resistor connected in parallel with each other;

a main amplifier for amplifying said voltage signals and outputting said electrical signals, said main amplifier being connected to said output terminal of said pre-amplifier; and a control circuit for outputting said control signal in accordance with said transmission speed, wherein said pre-amplifier varies a gain, a frequency bandwidth and a noise characteristic thereof by controlling said first and second switching devices with said control signal depending on said transmission speed.

2. The optical receiver according to claim 1, wherein said light-receiving device varies frequency bandwidth thereof in accordance with a bias voltage applied to another terminal of said light-receiving device.

3. The optical receiver according to claim 2, wherein said light-receiving device is a PIN photodiode.

4. The optical receiver according to claim 1, wherein said at least one resistor and said at least one circuit unit are connected in parallel to each other.

5. The optical receiver according to claim 1, wherein said at least one resistor and said at least one circuit unit are connected in serial to each other.

6. The optical receiver according to claim 1, wherein said trans-impedance further includes a variable resistor connected in serial to said at least one resistor.

7. The optical receiver according to claim 6, wherein said variable resistor is a transistor having a control terminal and two current terminals with equivalent resistance between said two current terminals capable of being varied by inputting said control signal to said control terminal or aid transistor.

8. The optical receiver according to claim 1, further includes, a housing having a stem and a die capacitor mounted on a center portion of said stem, wherein said light-receiving device is disposed on a substantially center of said stem through said die capacitor, said pre-amplifier is mounted on said stem, and said control signal is provided from said control circuit placed outside of said housing.

9. The optical receiver according to claim 8, wherein said stem further includes a lead pin, said control signal being provided to said light-receiving device and said control terminal of said pre-amplifier through said lead pin.

10. The optical receiver according to claim 8, wherein said pre-amplifier further provides a control buffer circuit and said stem further includes a lead pin, said control signal being provided to said light-receiving device through said lead pin and provided to said control terminal of said pre-amplifier through said lead pin and said control buffer circuit.

11. The optical receiver according to claim 1, wherein said main amplifier provides a control terminal for inputting said control signal, said control signal controlling frequency bandwidth of said main amplifier.

12. The optical receiver according to claim 11, wherein said main amplifier includes a first circuit, a filter circuit having a cut-off frequency, and a second circuit, at least one of said first and second circuits having gain, said cut-off frequency of said filter circuit being varied by said control signal.

13. The optical receiver according to claim 10, wherein said filter circuit includes a circuit unit having a switching device and a capacitor connected in serial to said switching device, said cut-off frequency of said filter circuit being switched by inputting said control signal to said switching device to conduct said capacitor connected thereto.

* * * * *